United States Patent [19]

Liu et al.

[11] Patent Number: 5,004,723
[45] Date of Patent: Apr. 2, 1991

[54] PREPARATION OF SUPERCONDUCTING EPITAXIAL FILM USING THE METHOD OF LIQUID-PHASE EPITAXIAL GROWTH

[75] Inventors: Ru-Shi Liu; Yao-Tsung Huang; Jau-Jier Chu; Jiuh-Ming Liang, all of Hsinchu, Taiwan

[73] Assignee: Industrial Technology Research Institute, Taiwan

[21] Appl. No.: 305,004

[22] Filed: Jan. 31, 1989

[51] Int. Cl.$^5$ .......................... B01D 9/00; H01L 39/12
[52] U.S. Cl. ....................................... 505/1; 156/607; 156/621; 422/246; 505/729
[58] Field of Search ................. 156/621, 607; 422/246; 505/1, 729

[56] References Cited

U.S. PATENT DOCUMENTS 4,347,230 8/1982 Nicolau ............................... 156/621
4,738,831 4/1988 Naumann et al. ..................... 156/621

OTHER PUBLICATIONS

Liu et al, Jap. Jour. Appl. Phys. 27 (Aug. 1988), L-1470.
Liu et al, Physica C 156 (1988), 785.
Takeya et al, Jap. Jour. Appl. Phys. 28 (Feb. 1989), L-229.

Primary Examiner—Upendra Roy
Attorney, Agent, or Firm—Scully, Scott, Murphy & Presser

[57] ABSTRACT

Preparation of superconducting epitaxial film using the method of liquid phase epitaxial growth comprising the steps of:
(1) melting the oxides of bismuth, calcium, strontium, and copper or the oxides of thallium, calcium, barium, and copper at temperature in the range of 900° C. to 950° C. to form a melt;
(2) contacting the melt in (1) with magnesium oxide or mono crystalline materials;
(3) lowering the temperature of the melt at a rate of 0.3°–2° C./min until the temperature is within the range of 820° C. to 890° C.;
(4) separating the melt and the magnesium oxide substrate or mono crystalline material to obtain a superconducting epitaxial film; and
(5) quenching said film in (4) until the temperature thereof is at room temperature, whereby a superconducting epitaxial film having a thickness of 40 to 150 μm is obtained.

4 Claims, 7 Drawing Sheets

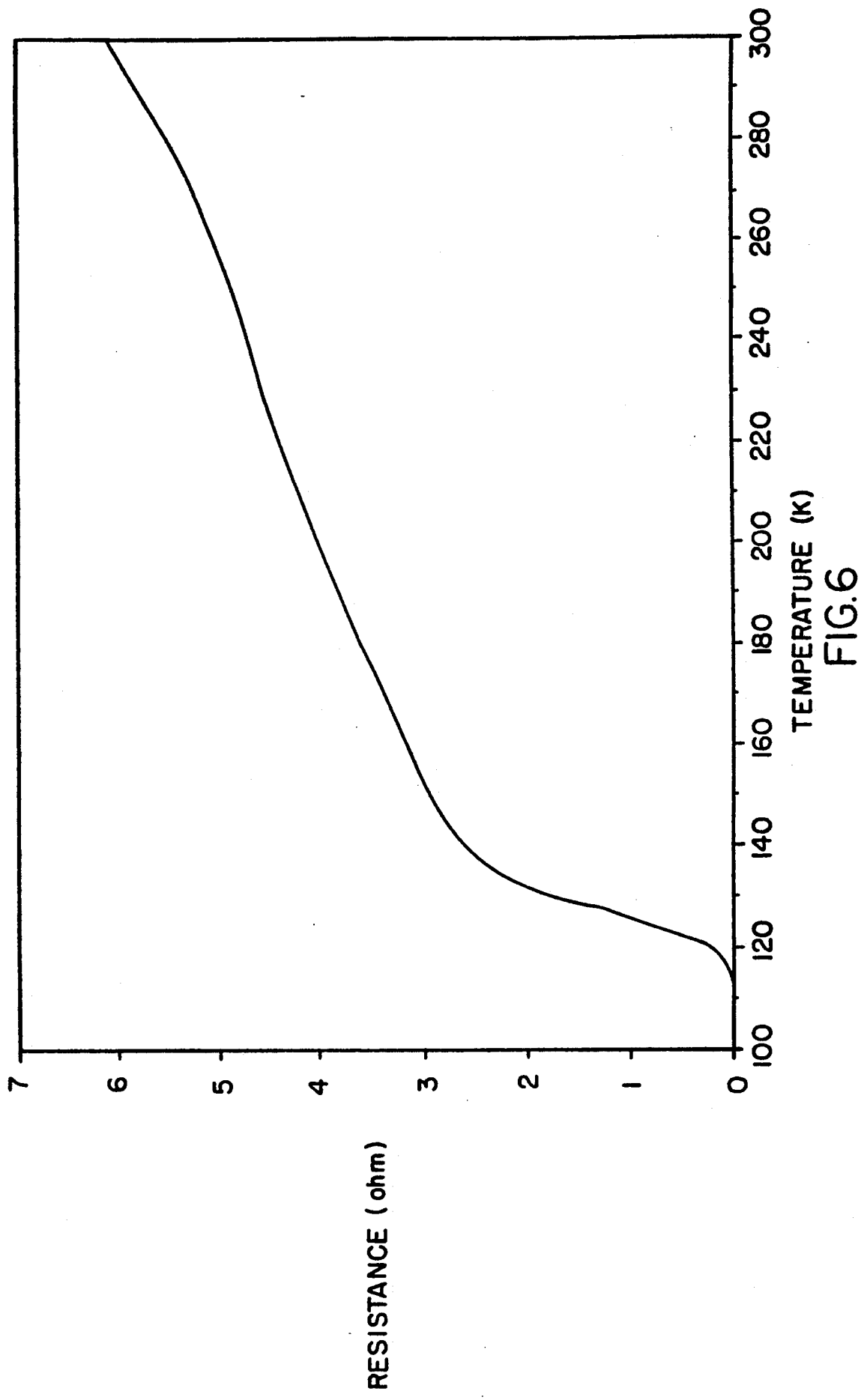

PREPARATION OF SUPERCONDUCTING EPITAXIAL FILM USING THE METHOD OF LIQUID-PHASE EPITAXIAL GROWTH

BACKGROUND OF THE INVENTION

The present invention relates to preparation of superconducting epitaxial film using the method of liquid-phase epitaxial growth.

Recently, there have been more and more projects and researches in the developing and exploitation of superconducting materials in many countries. In particular, scientists and technicians in the technology-orientated developed countries have been involved in the research, and large sums of money have also been invested in the research in the field of superconducting materials, especially in the preparation of superconducting epitaxial film for the application thereof in various types of sensors or high speed computers. Owing to the fact that Superconducting Quantum Interference Device (SQUID) can be used to detect the minute magnetic field, the use of "Josephson Effect" can produce high performance devices having operation speeds ten times faster than that of the traditional semiconductor devices. As a result, these superconducting materials will soon be used in super high speed computers. The application of such superconducting material will introduce a new era in industrial revolution and the preparation technique of high temperature superconducting materials is indeed to be considered as a high-tech research or exploitation at present.

Traditionally, several methods are used in the preparation of high temperature oxides superconducting epitaxial film: Argon Ions Sputtering Method, Electron Beam Evaporating Method, Molecular Beam Epitaxial Method, Laser Beam Evaporating Method, etc. However, there is a common shortcoming in the above methods—a vacuum environment is required for all of the mentioned methods to be carried out. Undoubtedly, a vacuum equipped system is exorbitant to be installed, and also, to produce a large epitaxial film is rather troublesome. Furthermore, the process for the preparation of the epitaxial film is very complicated and the factors such as gas flow rate, component ratio of the membrane, the components of the growth target, etc., which control the growth of epitaxial are needed to be accurately observed.

SUMMARY OF THE INVENTION

Accordingly, it is an object of the present invention to provide a method of preparation of superconducting epitaxial film using the method of liquid-phase epitaxial growth which mitigates the above drawbacks.

It is another object of the present invention to provide a method of preparation of epitaxial film which can be carried out in a non vacuum environment.

It is yet another object of the present invention to provide a method of preparation of epitaxial film which facilitates the production of epitaxial film having high quality and excellent performance.

Yet another object of the present invention is to provide a method of epitaxial film preparation which does not require post-heat treatment.

Still another object of the present invention is to provide a method for epitaxial film production which is economic easy to operate, time-saving and suitable for mass production.

The attainment of the foregoing and related objects, advantages and features of the invention should be more readily apparent after review of the following more detailed description of the invention, taken together with the drawings, in which.

BRIEF DESCRIPTION OF THE DRAWINGS

FIG. 4(a) and 4(b) are electron micrographs showing the lattice fringes of (001) planes of the bismuth-calcium-strontium-copper-oxide epitaxial film for the cross-sectional view of the samples, wherein FIG. 4(a) is a micrograph of the epitaxial film near the interface and FIG. 4(b) is a micrograph of the epitaxial film a distance away from the interface.

FIG. 6 is a graph, obtained by using the four-point probe method, showing the relation between the resistance and the corresponding temperature of the obtained thallium-calcium-barium-copper-oxide superconducting epitaxial film according to the present invention.

DETAILED DESCRIPTION OF THE INVENTION

The method of liquid-phase epitaxial growth according to the present invention is suitable for the production of various types of superconducting oxides such as bismuth series material (for example bismuth-calcium-strontium-copper- oxide) or thallium series material (for example thallium-calcium-barium-copper-oxide) epitaxial film. According to the method of liquid-phase epitaxial growth, a growing apparatus is employed. A variety of substrates can be used in the epitaxial growth apparatus. Preferably, a magnesium oxide substrate is used in the process according to the present invention. However, a single crystalline material may also be used. The method for the preparation of superconducting epitaxial film using the method of liquid phase epitaxial growth comprises the steps of:

(1) melting the oxides of bismuth, calcium, strontium, and copper or the oxides of thallium, calcium, barium, and copper at temperatures in the range of 900° C. to 950° C. for 0.5 to 5 hours to form a melt;

(2) contacting the melt in step (1) with magnesium oxide substrate or single crystalline materials within the epitaxial growth apparatus;

(3) lowering the temperature of the melt at a rate of 0.3°–2° C./min until the temperature thereof is within the range of 820° C. to 890° C.;

(4) separating the melt and the magnesium oxide substrate or single crystalline material to obtain a superconducting epitaxial film; and (5) quenching said film in step (4) until the temperature thereof is at room temperature, whereby a superconducting epitaxial film having a thickness of 40 to 150 μm is obtained.

The above series of material are further described hereafter. The following examples illustrate the method of preparation of the present invention. These examples are not intended to limit the scope of the present invention in any respect and should not be so construed.

EXAMPLE 1

Figure 1A:
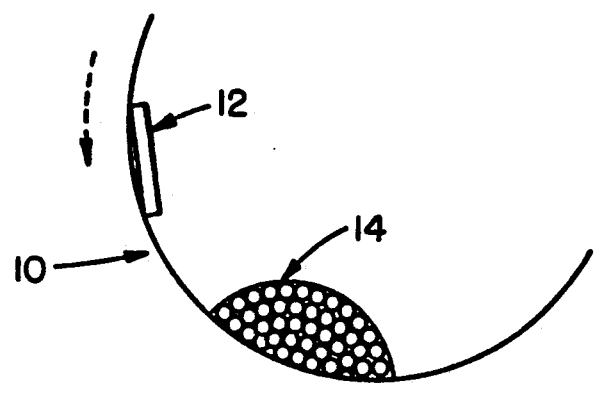
FIG. 1a through 1c are schematic views showing the process of operation for the preparation of the epitaxial film using the method of liquid-phase epitaxial growth, wherein the melt powder is placed within an epitaxial growth apparatus.
Figure 1B:
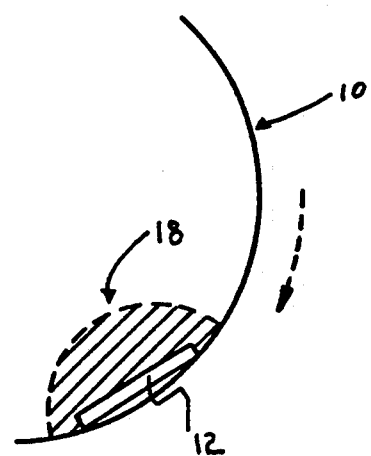
Figure 1C:
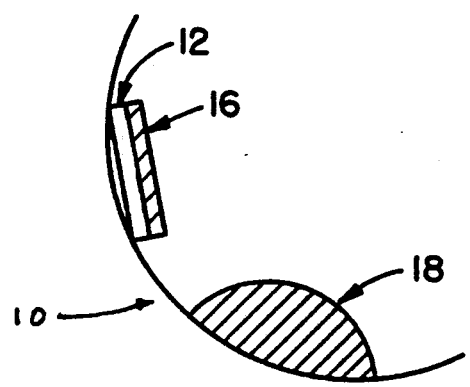

(A) The Preparation of Bismuth Series Superconducting Epitaxial Film (1) Mix and grind the mixture of calcium carbonate, strontium carbonate and copper oxide (wherein the molar ratio of calcium, strontium and copper is 3:3:4). The obtained mixture is calcined at the temperature of 850° C. for 12 hours. Mix the calcined powder with bismuth oxide (wherein, the molar ratio of bismuth:calcium:strontium:copper is 4:3:3:4);

(2) Place the above bismuth-calcium-strontium-copper-oxygen powder mixture into (a) a growing apparatus (FIG. 1(a)) (wherein the apparatus is made of high purity quartz with silver or gold sheet liner to avoid the reaction between and quartz and the melt at high temperature.). At the same time the magnesium substrate is placed aside from the melt powder;

(3) Place the above growing apparatus into a furnace having a temperature of 900°–950° C. for 0.5–5 hours. After the bismuth-calcium-strontium-copper-oxide has completely melted, the melt contacts the magnesium oxide substrate within the rotatable quartz apparatus (as shown in FIG. 1(b)). 20–30 minutes later, decrease the temperature at a rate of 0.5°–2° C. per minute to form bismuth-calcium-strontium-copper-oxide superconducting epitaxial film. After the temperature of the furnace has been lowered to about 880°–820° C., separate bismuth-calcium-strontium-copper-oxide melt from the magnesium oxide substrate (as shown in FIG. 1(c));

(4) Directly quench the temperature of the above obtained high temperature superconducting epitaxial film. When it reaches room temperature, the thickness of the film can be controlled to about 40–150 μm.

EVALUATION OF THE OBTAINED EPITAXIAL FILM

(1) Superconducting Transition Temperature Determination

Figure 2:
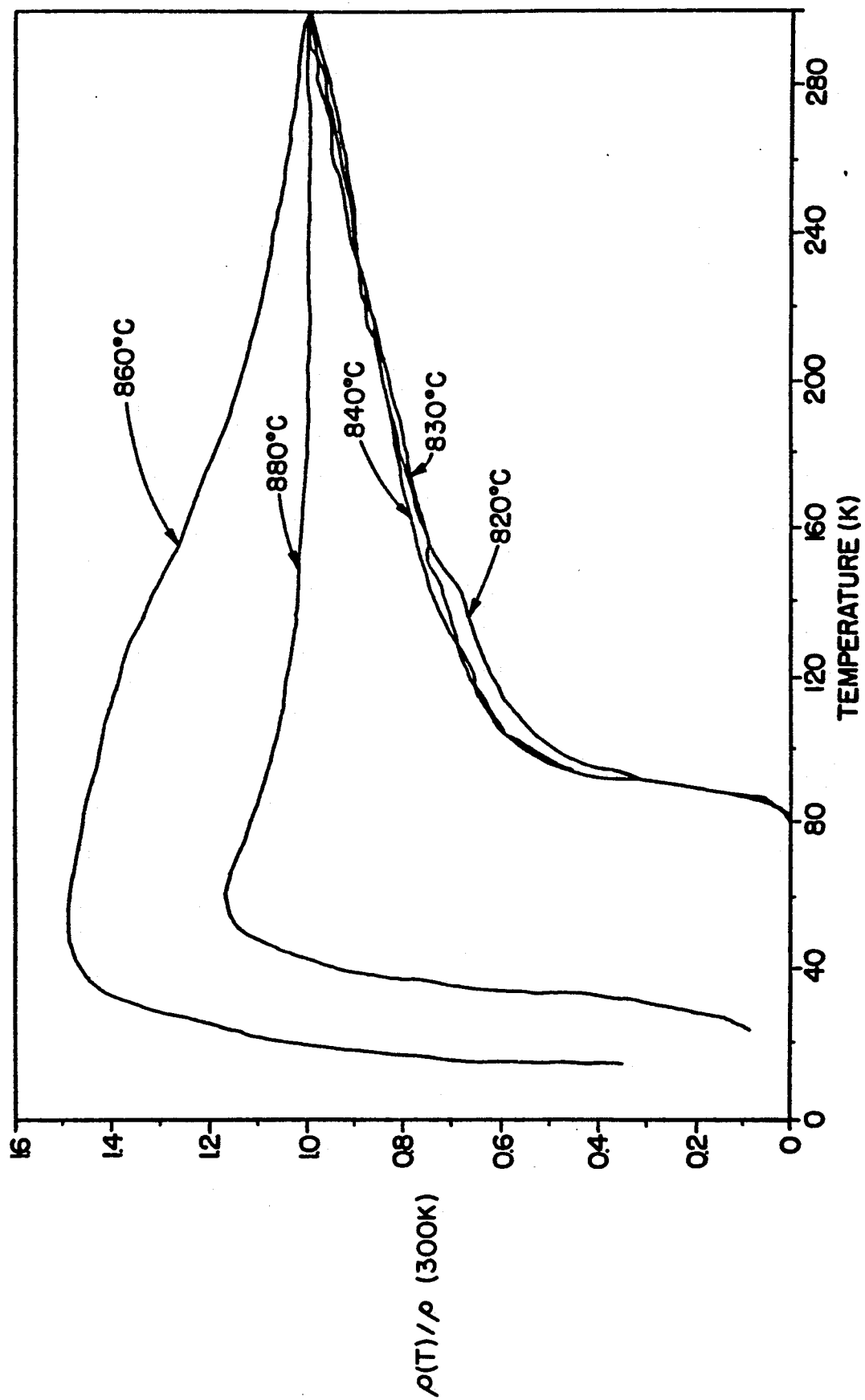
FIG. 2 is a graph, obtained by using the four-point probe method, showing the relation between the resistance and the corresponding temperature of the obtained bismuth-calcium-strontium-copper- oxide superconducting epitaxial film according to the present invention.

As shown in FIG. 2, the change of resistance corresponds with the temperature of the superconducting epitaxial film using the four-point probe method. From the graph, when the final temperature of the growth is 820°–840° C., the onset temperature of the superconducting film is 100K. The temperature at zero resistance is 80K. When the final temperature of the growth is in the range of 860°–880° C., the temperature of the superconducting is lowered to below 40° C.

From the above data, an excellence performance of the superconducting film is obtained by using the epitaxial growth film according to the present invention.

(2) X-ray Diffraction Examination

Figure 3:
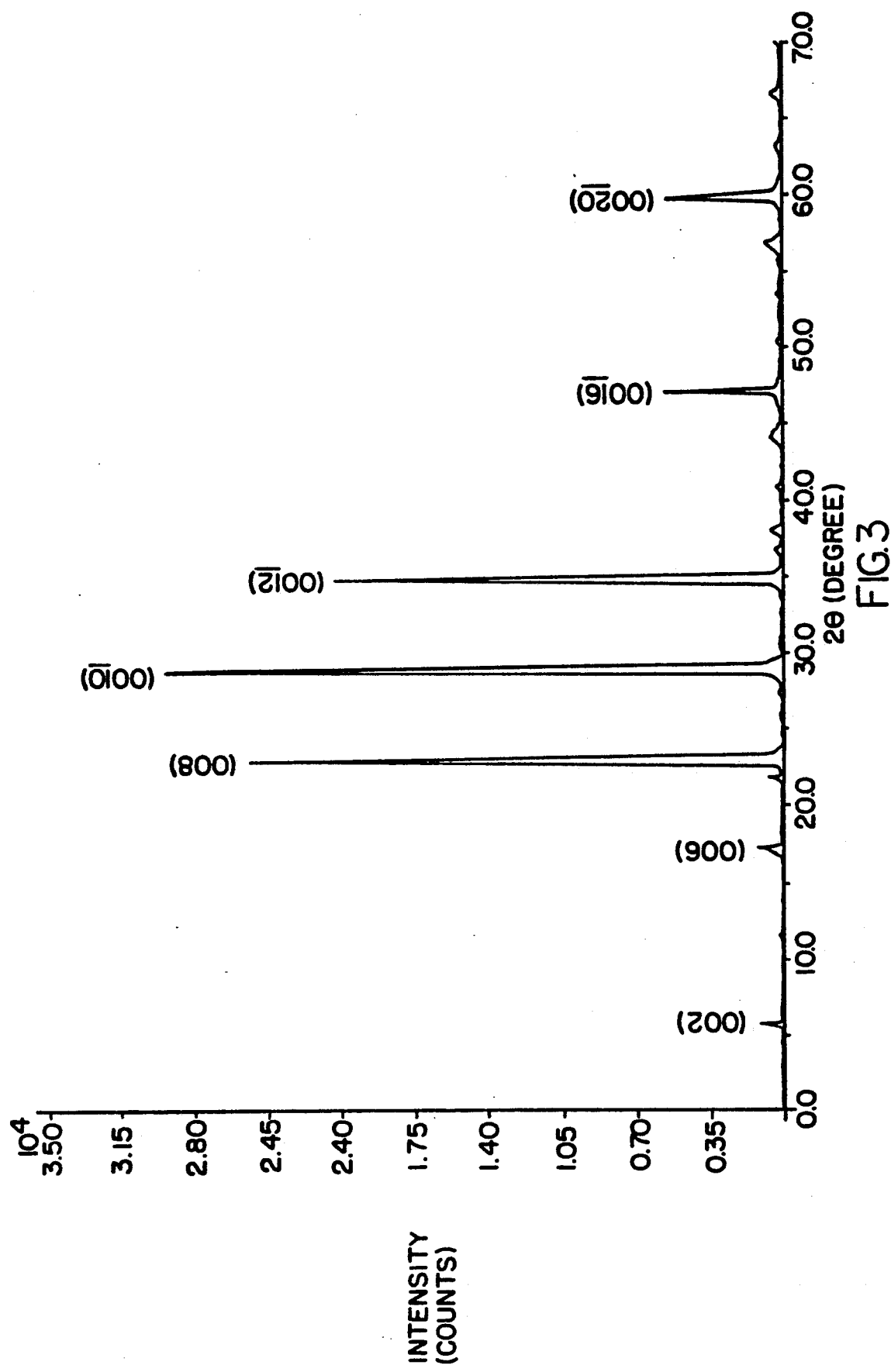
FIG. 3 is an X-ray diffraction diagram of the bismuth-calcium-strontium-copper-oxide epitaxial film according to the present invention using an X-ray diffractometer to determine the crystal structure of the film.

FIG. 3 indicates the result obtained by X-ray diffractometer on the above epitaxial film having a zero resistance of 80K. This determination is carried out to study the crystal structure thereof. In the graph, the horizontal axis indicates the phase angle (2θ) of the diffraction of the X-ray diffractometer. The vertical axis indicates the intensity.

From the figure, it shows that the films are highly preferentially oriented with respect to the magnesium oxide substrate with the C axis parallel to the normal of the substrate surface. As seen in FIG. (3), only diffraction lines corresponding to (001) planes (l=2, 6, 8, 10, 12, 16, 20 . . .) of the films were present in the X-ray diffraction pattern. The graph indicates that the quality of the superconducting epitaxial film is excellent and its electromagnetism properties can sufficiently be presented.

(3) Transmission Electron Microscope Examination

Figure 4A:
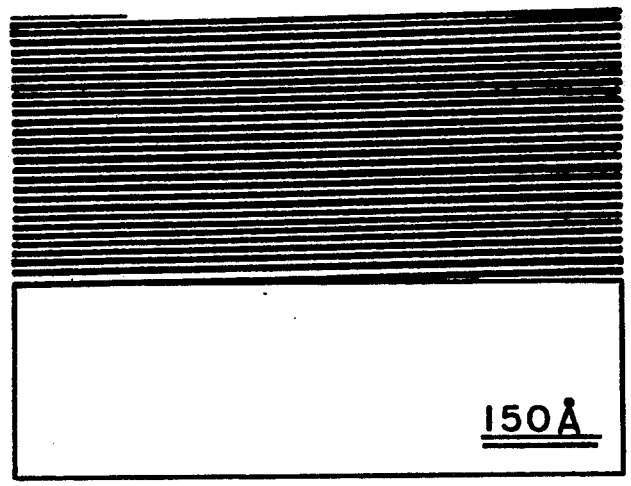
Figure 4B:
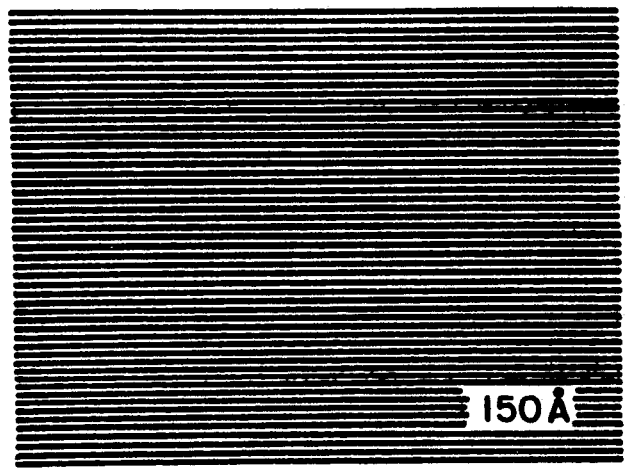

FIG. 4 indicates micrographs obtained by means of a high-resolution transmission electron microscope for cross-sectional view of the samples of the superconducting film. FIG. 4(a) is a micrograph of the epitaxial film near the magnesium oxide substrate while FIG. 4(b) is a micrograph of the epitaxial film which is far apart from the magnesium oxide substrate. High-resolution lattice imagings of the cross-sectional view of the samples also indicated that the (001) planes of the films are parallel to the (001) magnesium oxide planes. Based on this analysis, the critical current density may be increased tremendously.

Figure 5A:
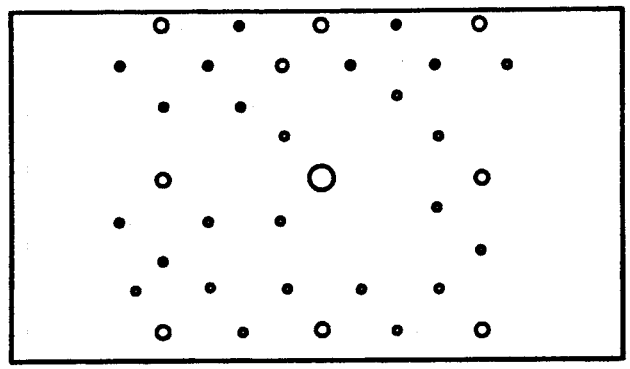
FIG. 5(a) is an overlapping [001] bismuth-calcium-strontium-copper-oxide/[001] magnesium oxide electron diffraction pattern and FIG. 5(b) is an indexed pattern of bismuth-calcium-strontium-copper-oxide spots () and magnesium oxide spots (). The double diffraction spots are omitted.
Figure 5B:
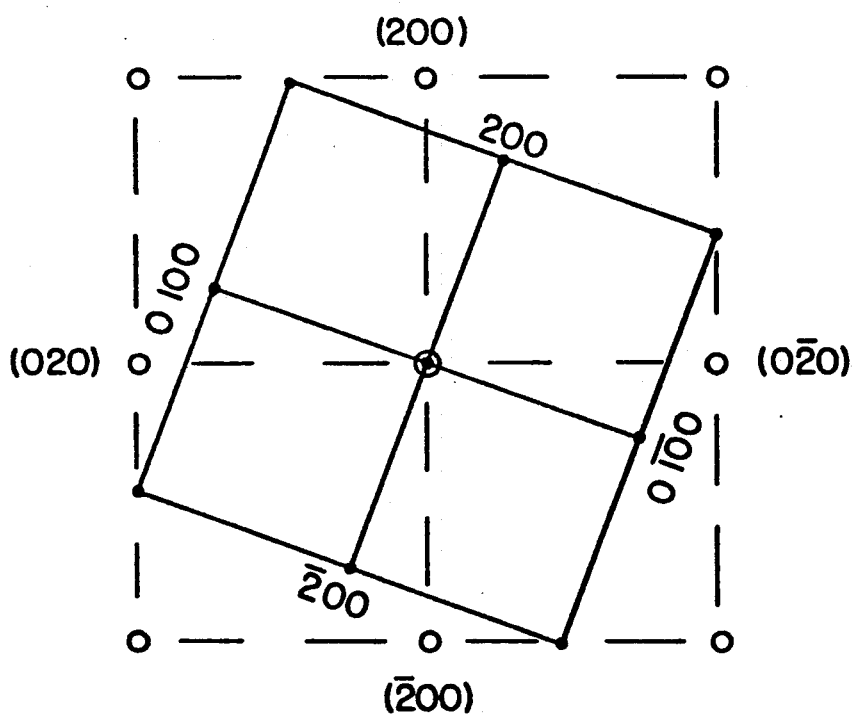

FIG. 5(a) is an overlapping [001] bismuth-calcium-strontium-copper-oxide/[001] magnesium oxide electron diffraction pattern for top-view of the sample. FIG. 5(b) is a indexed pattern. Misorientations of epitaxial films with respect to the substrate by a rotation along [001] MgO axis up to 20° were found. The observations indicated that the grains of the thin film had a tendency to rotate towards the orientations so that the overlayer films exhibited definite orientation relationships with respect to the MgO substrate which are presumably of a low-energy state.

In conclusion, the superconducting epitaxial film of bismuth-calcium-strontium-copper-oxide obtained using the method according to the present invention indeed possesses excellent superconducting properties.

EXAMPLE 2

(B) Preparation of Thallium Series Superconducting Epitaxial Film (1) Mix and grind the mixture of calcium carbonate, barium carbonate and copper oxide (wherein, the molar ratio of calcium:barium:copper is 1.33:1.00:2.00). The obtained mixture is calcined at 920°–930° C. for 10–15 hours. Mix the calcined mixture with thallium oxide (wherein, the molar ratio of thallium:calcium:barium:copper is 1.33:1.33:1.00:200).

(2) Place the above thallium-calcium-barium-copper-oxide powder mixture into the apparatus of FIG. 1(a), an epitaxial growth apparatus. At the same time the magnesium oxide substrate is placed on other side away from the mixture.

(3) Place the above growing apparatus into a furnace having a temperature of 930° C.–950° C. Fill in with oxygen ( to avoid the reaction of $Tl_2O_3$ into $Tl_2O$ and $O_2$, which reduces the amount of thallium) and heat for about 0.5–1.0 hour. After thallium-calcium-barium-copper-oxide has been melted completely, a rotatable quartz growing apparatus is used so as to contact the melt with the magnesium oxide substrate (as shown in FIG. 1(b)). 10 to 20 minutes later, the temperature is decreased at a rate of 0.3°–1° C. per minutes to form a thallium-calcium-calcium-copper-oxide superconducting film. After the temperature of the furnace has been lowered to 890° C., separate the melt of thallium-calcium-barium-copper-oxide with magnesium Oxide substrate (as shown in FIG. 1(c)).

(4) Cool the high temperature superconducting film. When it reaches room temperature, the thickness of the film can be controlled to 40–80 μm.

EVALUATION OF THE OBTAINED EPITAXIAL FILM

(1) Superconducting Transition Temperature Determination

FIG. 6 indicates the relationship between the resistance and the temperature of the superconducting epitaxial film. The graph indicates that the onset temperature of the superconducting film is 140K, and the temperature at the zero resistance is 111K. This shows that the above superconducting epitaxial film possesses excellent properties of superconducting.

(2) X-ray Diffraction Examination

Figure 7:
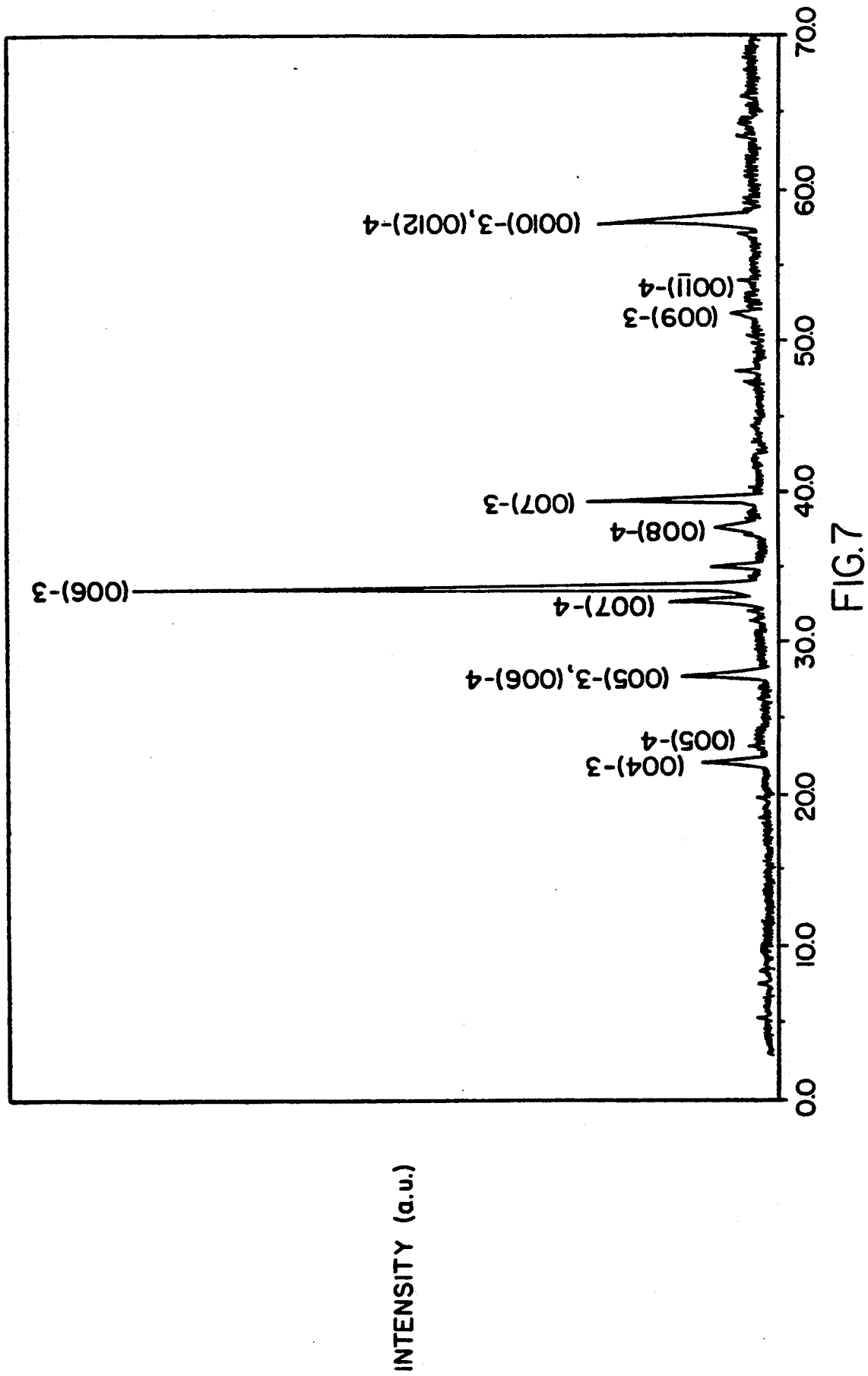
FIG. 7 is a X-ray diffraction diagram of the thallium-calcium-barium-copper-oxide epitaxial film according to the present invention using an X-ray diffractometer to determine the crystal structure of the film.

FIG. 7 indicates the use of X-ray diffractometer to determine the crystal structure of the above superconducting epitaxial film having a zero resistance temperature of 80K. In the graph of FIG. 7, the horizontal axis represents the phase angle (2 ) of diffraction of the X-ray diffractometer. The vertical axis represents the intensity. It can indicate the C axis being perpendicular to the (001) plane of the magnesium oxide substrate. However, from the analysis of transmission electron microscope, the main superconducting phase is $TlCa_2Ba_2Cu_3O_y$ under the space group of P4/mmm; whereas for a=b=0.38 nm, c=1.59 nm; and for those peaks having (004), (005), (006), (007), (009), (0010), the minor superconducting phase is $TlCa_2Ba_3Cu_4O_y$ under the space group of P4/mmm; whereas a=b=0.39 nm, c=1.97 nm; and for those peaks having (005), (006), (007), (008), (0011), (0012), the onset temperature of superconducting at 140K is related to $Tlca_2Ba_3Cu_4O_y$, and zero resistance temperature at 111K is related to $TlCa_2Ba_2Cu_3O_y$.

(3) Transmission Electron Microscope Examination

The results for the observation of the thallium-calcium-barium-copper-oxide epitaxial film under electron microscope and diffraction are alike with that of the bismuth-calcium-copper-oxide epitaxial film. Thus for further detail of the result, the foregoing may be applied.

As apparent from the above, the production of high temperature epitaxial film using liquid phase epitaxial growth according to the present invention provides advantages such as the elimination of vacuum equipment of the tradition method. The steps for the preparation of epitaxial film are simple and can shorten the operation time and lower the cost of manufacturing.

We have described our invention by means of specific illustrations. However, this invention is susceptible to obvious modifications which are intended to be included in the scope of the invention as described and as hereinafter claimed:

We claim:
1. LPE growth of super conducting oxide films comprising the steps of:
   (a) melting the oxides of bismuth, calcium, strontium, and copper or the oxides of thallium, calcium, barium, and copper at temperature in the range of 900° C. to 950° C. to form a melt;
   (b) contacting the melt in (a) with magnesium oxide or single crystalline materials;
   (c) lowering the temperature of the melt at a rate of 0.3°–2° C./min. until the temperature is within the range of 820° C. to 890° C.;
   (d) separating the melt and the magnesium oxide substrate or single crystalline material to obtain a superconducting epitaxial film; and
   (e) cooling said film in (d) until the temperature thereof is at room temperature, whereby a superconducting epitaxial film having a thickness of 40 to 150 μm is obtained.

2. A method as set forth in claim 1, wherein the melting of the oxides in the temperature range of 900° C. to 950° C. is conducted for 0.5 to 5 hours.

3. A method as set forth in claim 1, wherein the molar ratio of bismuth:calcium:strontium:copper is approximately 4:3:3:4.

4. A method as set forth in claim 1, wherein the molar ratio of thallium:calcium:barium:copper is 1.33:1.33:1.00:2.00.

* * * * *

UNITED STATES PATENT AND TRADEMARK OFFICE
CERTIFICATE OF CORRECTION

PATENT NO. : 5,004,723

DATED : April 2, 1991

INVENTOR(S) : Ru-Shi Liu, et al.

It is certified that error appears in the above-identified patent and that said Letters Patent is hereby corrected as shown below:

Column 2, Line 34, (the first occurrence) "spots O " should read as --spots (●)--.

Column 3, Line 18, after "construed." insert as new paragraph:

--More specifically FIG. 1 is a schematic view showing apparatus for the preparation of the epitaxial film using the method of liquid-phase epitaxial growth in a quartz boat 10 having a silver or gold sheet liner in which a melt powder 14 is placed in the boat for growing such an epitaxial film on substrate 12. The apparatus 10 is placed in a furnace that can be raised to a temperature of about 900 to about 950°C for melting the powders 14 and the melt 18 thus obtained made to contact the substrate 12 by rotating apparatus 10 as shown in FIG 1(b). The temperature is then decreased after the

UNITED STATES PATENT AND TRADEMARK OFFICE
CERTIFICATE OF CORRECTION

PATENT NO. : 5,004,723                                       Page 2 of 2

DATED     : April 2, 1991

INVENTOR(S) : Ru-Shi Liu, et al.

It is certified that error appears in the above-identified patent and that said Letters Patent is hereby corrected as shown below:

substrate 12 is rotated away from the melt powders 14 to obtain a substrate 12 having a superconducting epilayer 16 and leaving residual melt 18 in the apparatus 10 as illustrated in Fig 1 (c).--

Signed and Sealed this

Twenty-fifth Day of August, 1992

*Attest:*

DOUGLAS B. COMER

*Attesting Officer*   Acting Commissioner of Patents and Trademarks